(12) United States Patent
Kim et al.

(10) Patent No.: US 6,205,062 B1
(45) Date of Patent: Mar. 20, 2001

(54) CAS LATENCY CONTROL CIRCUIT

(75) Inventors: Dong Kyeun Kim; Sung Hoon Kim, both of Chungcheongbuk-do (KR)

(73) Assignee: Hyundai Electronics Industries Co. Ltd., Kyoungki-do (KR)

( * ) Notice: Subject to any disclaimer, the term of this patent is extended or adjusted under 35 U.S.C. 154(b) by 0 days.

(21) Appl. No.: 09/436,728

(22) Filed: Nov. 9, 1999

Related U.S. Application Data

(63) Continuation-in-part of application No. 09/374,765, filed on Aug. 16, 1999, now Pat. No. 6,125,064.

(30) Foreign Application Priority Data

Nov. 13, 1998 (KR) .................................. 98-48677
Nov. 24, 1998 (KR) .................................. 98-50441

(51) Int. Cl.[7] .................................. G11C 7/00
(52) U.S. Cl. .................. 365/193; 365/194; 365/191; 365/233; 365/23.08; 365/189.05
(58) Field of Search .................. 365/191, 193, 365/194, 189.05, 233, 230.08

(56) References Cited

U.S. PATENT DOCUMENTS

| | | | |
|---|---|---|---|
| 5,587,950 | * | 12/1996 | Sawada et al. .................. 365/201 |
| 5,594,704 | * | 1/1997 | Konishi et al. .................. 365/233 |
| 5,764,584 | * | 6/1998 | Fukiage et al. .................. 365/230.03 |
| 5,802,005 | * | 9/1998 | Nakamura et al. .................. 365/230.03 |
| 5,815,462 | * | 9/1998 | Konishi et al. .................. 365/233 |
| 5,940,328 | * | 8/1999 | Iwamoto et al. .................. 365/189.01 |
| 5,982,697 | * | 11/1999 | William et al. .................. 365/230.03 |

FOREIGN PATENT DOCUMENTS

| | | | |
|---|---|---|---|
| 006660329 A2 | * | 6/1995 | (EP) . |
| 408180676 | * | 7/1996 | (JP) . |
| 409265777A | * | 10/1997 | (JP) . |
| 02000149556 | * | 5/2000 | (JP) . |

* cited by examiner

Primary Examiner—Viet Q. Nguyen
(74) Attorney, Agent, or Firm—Fleshner & Kim, LLP

(57) ABSTRACT

A Column Address Strobe (CAS) latency control circuit for a SDRAM and a layout of the same allows an adequate CAS latency operation allowance at a high operation frequency. The SDRAM includes a plurality of banks each having 'n' main amplification units, 'n' bit data buses disposed between the plurality of banks each shared by respective main amplification units, 'n' CAS latency control circuits disposed concentrated central to the data buses one to one matched to the data buses, 'n' DQ blocks disposed connected to outputs of respective CAS latency control circuits in lengths different from one another, and a clock buffer for applying a clock signal to the CAS latency control circuits.

20 Claims, 14 Drawing Sheets

US 6,205,062 B1

CAS LATENCY CONTROL CIRCUIT

This application is a continuation-in-part application of application Ser. No. 09/374,765 filed Aug. 16, 1999, now U.S. Pat. No. 6,125,064 whose entire disclosure is incorporated herein by reference thereof.

BACKGROUND OF THE INVENTION

1. Field of the Invention

The present invention relates to a memory device, and more particularly to a Column Address Strobe (CAS) latency control circuit for a memory device.

2. Background of the Related Art

In general, Dynamic Random Access Memories (DRAMs) are composed of capacitors and transistors, and are widely used as highly integrated semiconductor memories. However, because the operation of a DRAM is controlled by delaying command signals (RASB and CASB, etc.) and data therein is read in response to a Y-address signal, the DRAM has the disadvantage that data read time is long and slow. Consequently, Synchronous DRAMs (SDRAMs), have recently been developed with increased read and write speeds.

A related art CAS latency control circuit for a SDRAM will be described with reference to the attached drawings. Referring to FIG. 1, a related art SDRAM includes four banks BANK0, BANK1, BANK2, and BANK3, each having n main amplification units MA0i-MA0j, MA1i-MA1j, MA2i-MA2j, and MA3i-MA3j, which are secondary amplifier circuits. Each bank is further coupled to a n-bit data bus, and each of the main amplification units MA0i-MA0j, MA1i-MA1j, MA2i-MA2j, and MA3i-MA3j in each of the banks share data bus DATAi-DATAj of the same number in common. The SDRAM further includes n CAS latency control circuits CLCCi-CLCCj which are matched one to one to the data buses, such that the (i)th CAS latency control circuits share the (i)th data bus.

Chip pads in a chip are also arranged at particular locations which correspond to locations of input/output pins which are fixed in a general standard SDRAM. In FIG. 1, clock pads for clock inputs are arranged at a central portion of the chip, and DQ blocks DQi-DQj, which include data output buffers and pads, are positioned in a spread formation at the right side of the chip near BANK2 and BANK3. They are sequenced in the order corresponding to locations of data pins. Therefore, since each of the n DQ blocks DQi-DQj includes a data buffer and an input/output pad, the DQ blocks DQi-DQj are positioned at particular locations, and the n CAS latency control circuits CLCCi-CLCCj are positioned at locations adjacent to the DQ blocks. Further, there is a one to one correspondence between the CAS latency control circuits and the DQ blocks, so that outputs of the CAS latency control circuits CLCCi-CLCCj are connected to respective DQ blocks DQi-DQj. Additionally, the positioning of the CAS latency control circuits and their respective DQ blocks is such that the distance between them is kept relatively small.

A QCLK buffer is positioned at a location adjacent to the clock pad for providing a clock signal to the CAS latency control circuits CLCCi-CLCCj, and clock signal QCLK connection lines are connected to respective CAS latency control circuits CLCCi-CLCCj.

Referring to FIG. 2, the related art CAS latency control circuit for a SDRAM is provided with three latches 2, 3, and 4, and a controlling circuit unit 1 for controlling the three latches 2, 3, and 4. Thus, controlling circuit unit 1 receives a clock signal QCLK for forwarding data, and provides control signals con1, con2, and con3 for controlling respective latches 2, 3, and 4.

First latch 2 either forwards or latches input data depending on the control signal con3 from the controlling circuit 1. Second latch 3 either forwards or latches the data from the first latch 2 according to the control signal con2 from the controlling circuit unit 1. Third latch 4 either forwards the data from the second latch 3 to an output buffer or latches the data from the second latch 3 according to the control signal con1 from the controlling circuit unit 1.

Referring to FIG. 3, each of the latches 2, 3, and 4 is provided with a first inverter 6 which inverts a control signal con3, con2, con1 from the controlling circuit unit 1. A first control inverter 5 passes data D when the control signal con1, con2, or con3 is "low" in response to the control signal con3, con2, or con1 and the signal from the first inverter 6. This is in the open condition of the latch- A second inverter 8 inverts a signal from the first control inverter 5, and a second control inverter 7 latches a data signal from the second inverter 8 when the control signal con1, con2, or con3 is "high" in response to the control signal con3, con2, or con1 and the signal from the first inverter 6.

Referring to FIG. 4, the control inverter 5 or 7 in each of the latches is provided with first and second PMOS transistors 9 and 10, and first and second NMOS transistors 11 and 12 between a constant supply voltage terminal and a ground voltage terminal. The second PMOS transistor 10 and the first NMOS transistor 11 receive a data signal $D_{in}$ at gates thereof, and the first PMOS 9 receives the control signal con3, con2, or con1 from the controlling circuit unit 1 or a signal from the first inverter 6 at a gate thereof. The second NMOS transistor 12 receives the control signal con3, con2, or con1 from the controlling circuit unit 1 or a signal from the first inverter 6 at a gate thereof, and an output terminal 13 is provided at a node of the second PMOS transistor 10 and the first NMOS transistor 11.

FIG. 5 illustrates a first timing diagram of the related art CAS latency control circuit operation, FIG. 6 illustrates a second timing diagram of the related art CAS latency control circuit operation, FIG. 7 illustrates a third timing diagram of the related art CAS latency control circuit operation, and FIG. 8 illustrates a fourth timing diagram of the related art CAS latency control circuit operation.

Referring to FIG. 5, the controlling circuit unit 1 provides control signals con1, con2, and con3 all at "low" at a first rising edge of a clock signal QCLK, so that all the latches 2, 3, and 4 do not latch data, but instead directly bypass the data. Therefore, the output data Dout is provided at a second rising edge of the clock signal QCLK.

Referring to FIG. 6, the controlling circuit unit 1 provides a control signal con1 to be applied to the third latch 4 at "high" and control signals con2 and con3 to be applied to the first and second latches 2 and 3 respectively at "low" at a first rising edge of a clock signal QCLK, so that the first and second latches do not latch the data. Instead, the data is passed directly to the third latch, which receives the data. Next, the controlling circuit unit 1 controls the control signal con1 to transition from "high" to "low" at a second rising edge of the clock signal, so that the data passes through the third latch 4 and proceeds toward the data output buffer. The controlling circuit unit 1 then transitions the control signal con1 from "low" to "high" again before a third rising edge of the clock signal, so that the data is latched at the third latch.

Referring to FIG. 7, the controlling circuit unit 1 holds the control signal con3 low and control signals con1 and con2 high in synchronization with the clock signal QCLK. It then transitions the control signal con1 from high to low after a second rising edge of the clock signal QCLK, and after a prescribed time period, from low to high again. The controlling circuit unit 1 causes the control signal con2 to transition from high to low when the control signal con1 transitions from low to high, and then from low to high at a third rising edge of the clock signal. Accordingly, the control signals con1 and con2 repeat the aforementioned process in a fourth rising edge of the clock signal. As the control signal is held low, the data passes through the first latch 2 to the second latch 3, and passes through the second latch 3 to the third latch 4 when the control signal con2 transitions to low.

In this instance, as the control signal con2 transitions to high again, the second latch 3 latches and holds the data provided to the third latch 4 until the control signal con2 transitions to low, again. And, when the control signal con1 transitions to low in a second cycle, the third latch 4 forwards the data toward the data output buffer, and when the control signal con1 transitions to high again, latches the data until the control signal con1 transitions to low and holds the data until the next cycle.

Referring to FIG. 8, the controlling circuit unit 1 maintains all of the control signals con1, con2, and con3 at a high level until a second rising edge of the external clock signal QCLK, when the control signals con1, con2, and con3 are transited to low in sequence. Therefore, when a pertinent signal transitions to low, the first latch 2 provides the latched data to the second latch 3, the second latch 3 provides to the third latch 4, and the third latch 4 provides to the data output buffer. Alternatively, when a pertinent control signal transitions from low to high, the data is latched. Thus, as data is provided depending on a user's selection of a mode of the first to fourth CAS latencies, the SDRAM operates faster than a general DRAM.

However, the related art CAS latency control circuit for a SRAM has various problems. For example, passing data through all the series connected latches, regardless of the cases of CAS latency, results in an unnecessary data transmission delay. Particularly, as the data passes directly through the first, second, and third latches without being latched by any of the latches, as in the case of the first CAS latency, or latched only by the third latch as in the case of second CAS latency, data transmission delay becomes a problem.

Additionally, the aforementioned related art CAS latency control circuit for a SDRAM has various problems. For example, the layout of the related art CAS latency control circuits and corresponding DQ blocks on a chip causes a clock signal QCLK skew between CAS latency control circuits CLCC located close to a clock buffer and CAS latency control circuit CLCC located far from the clock buffer.

Additionally, the distortion of data rates increases between reading of the first and second banks BANK0 and BANK1 and reading of the third and fourth banks BANK2 and BANK3. This is illustrated in the timing diagram of FIG. 9, which shows a case in which there are no clock signal QCLK and data skews in operation of a related art CAS latency, and the timing diagram of FIG. 10, which illustrates a data output timing diagram in a case in which there are clock signal QCLK and data skews in operation of a related art CAS latency. In these figures, tCK denotes a clock cycle, tS denotes a CAS latency latch set up time, tH denotes a CAS latency hold time, skew1 denotes a clock skew in each CAS latency control circuit, and skew2 denotes data skew for each bank. If there were no QCLK and data skews, a CAS latency operation would have an adequate latch allowance. Because there are clock signal QCLK and data skews, however, the CAS latency operation has inadequate allowances tS and tH, and particularly, the CAS latency operation becomes difficult at a high frequency due to shorter clock cycle of the higher frequency, which results in a greater QCLK and data skews.

The above references are incorporated by reference herein where appropriate for appropriate teachings of additional or alternative details, features and/or technical background.

SUMMARY OF THE INVENTION

The present invention substantially obviates one or more of the problems due to limitations and disadvantages of the related art.

An object of the present invention is to prevent the passing of data through unnecessary latches, thus preventing unnecessary data delay.

Another object of the present invention is to improve the operational speed.

Another object of the present invention is to minimizes the clock signal QCLK and data skews given to each CAS latency control circuits.

To achieve these and other advantages and in accordance with the purpose of the present invention, as embodied and broadly described, the SDRAM includes a plurality of banks each having 'n' main amplification units, 'n' bit data buses disposed between the plurality of banks each shared by respective main amplification units, 'n' CAS latency control circuits disposed concentrated central to the data buses one to one matched to the data buses, 'n' DQ blocks disposed connected to outputs of respective CAS latency control circuits in lengths different from one another, and a clock buffer for applying a clock signal to the CAS latency control circuits.

In order to achieve at least the above-described objects of the present invention in a whole or in parts, there is provided memory device that includes a plurality of memory banks, each bank having a plurality of main amplifiers, each main amplifier amplifying output signals from said memory bank, a plurality of data buses arranged between the plurality of banks, each shared by respective main amplification units, a latency controller concentrated in an area central to the data buses and one to one matched to the data buses to receive signals from said plurality of data buses, a plurality of DQ circuits coupled to receive the outputs of respective CAS latency control circuits, and a clock buffer for applying a clock signal to the CAS latency controller, wherein the distance of each of said plurality of DQ circuits to the CAS latency controller is different.

To further achieve the above-described objects of the present invention in a whole or in parts, there is provided a latency control circuit that includes a control circuit adapted to receive a clock signal to regulate data output and a plurality of input signals to provide first, second and third control signals, a first logic gate for logically combining a CAS latency control signal with data, a first latch to pass or latch data from said first logic gate in response to the third control signal from said control circuit unit, a second logic gate for logically combining a second logic gate control signal with data, a second latch to pass or latch data from said first latch or to pass or latch a data from said second logic gate in response to the second control signal from the control circuit unit, and a third latch to pass data from said second latch to a data output buffer or latch the data in response to the first control signal from said control circuit unit.

To further achieve the above-described objects of the present invention in a whole or in parts, there is provided a Column Address Strobe (CAS) latency control circuit that includes a first data latch responsive to a first control signal, a controller, wherein the controller receives a clock signal and generates the first control signal, the first data latch being coupled to receive first and second input signals and output a first output signal, wherein the first output signal is one of (1) the first input signal forwarded without latching through the first data latch, (2) the first input signal latched and subsequently forwarded through the first data latch, (3) the second input signal forwarded without latching through the first data latch, and (4) the second input signal latched and subsequently forwarded through the first data latch, in response to the first control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
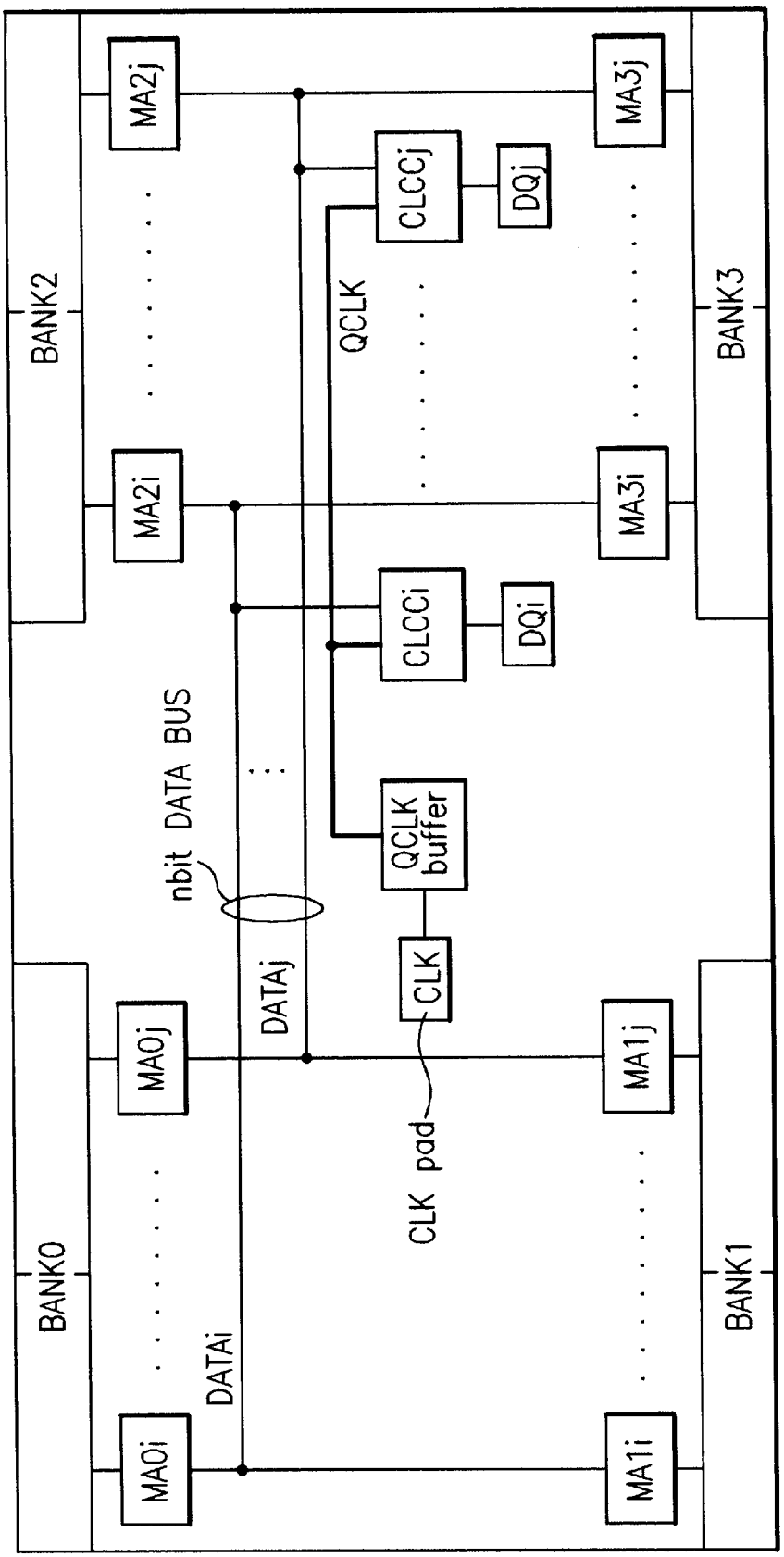
FIG. 1 is a drawing which illustrates of related art CAS latency control circuits in a SDRAM.
Figure 2:
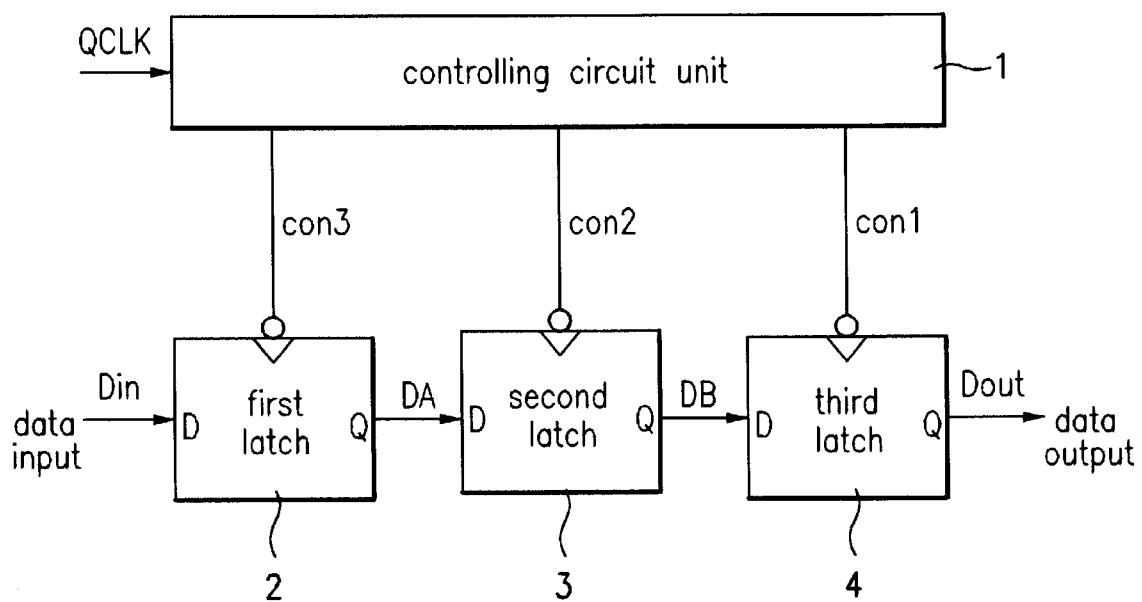
FIG. 2 is a drawing illustrating a related art CAS latency control circuit for a SDRAM.
Figure 3:
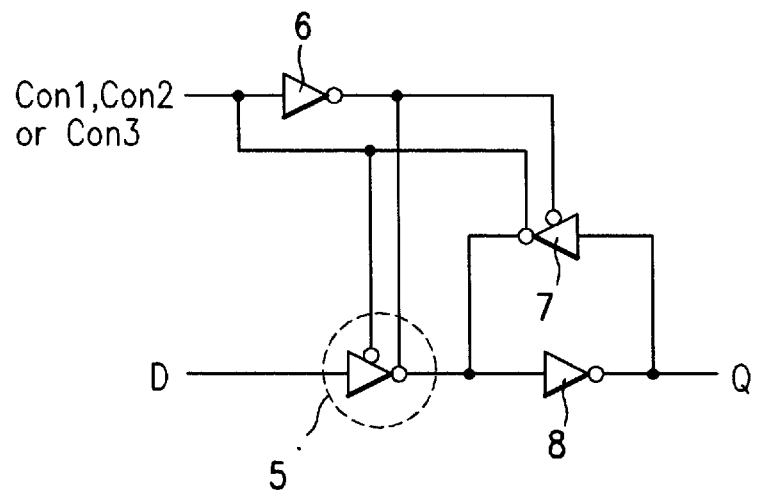
FIG. 3 is a drawing illustrating system of the latching unit in FIG. 2.
Figure 4:
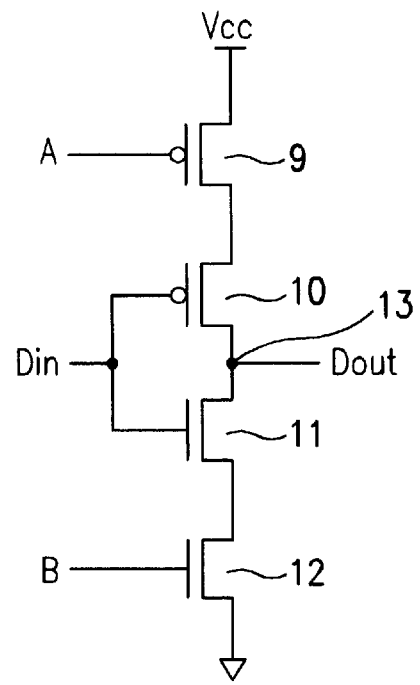
FIG. 4 is a drawing illustrating a system of the control inverter in FIG. 3.
Figure 5:
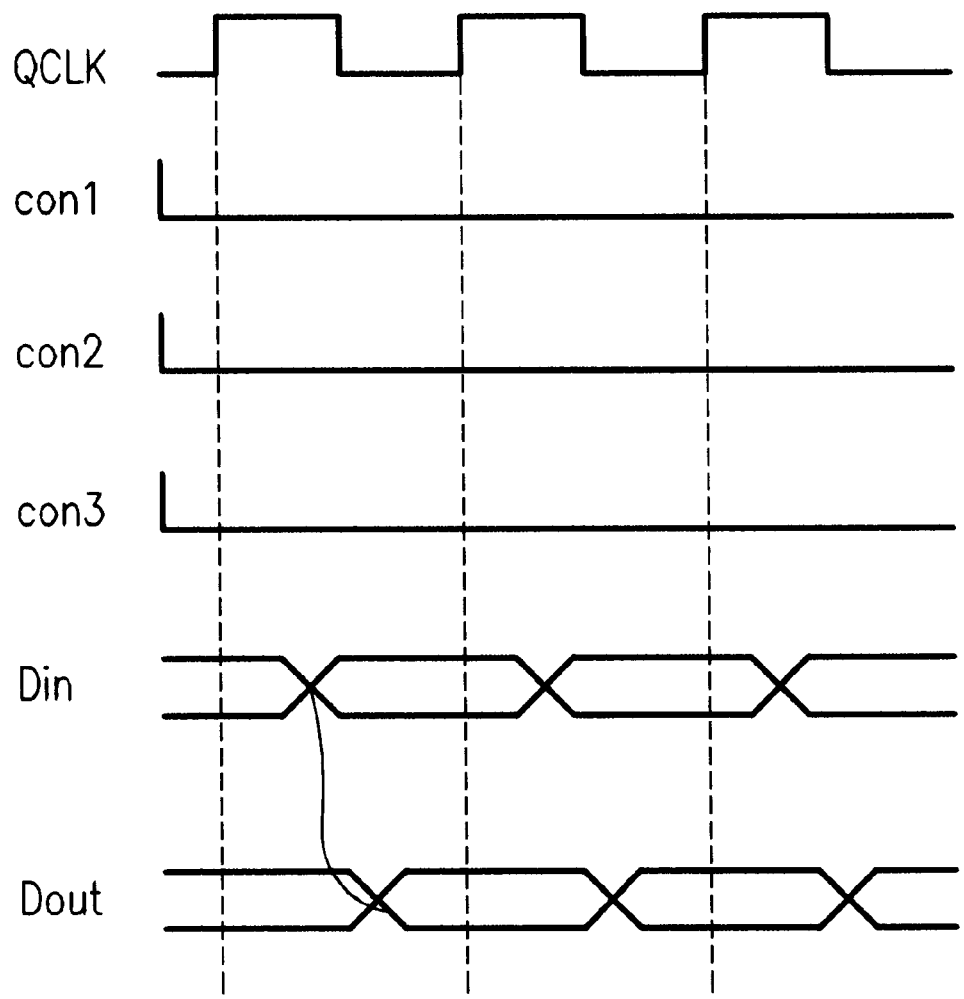
FIG. 5 is a drawing illustrating an operation timing diagram of a related art first CAS latency.
Figure 6:
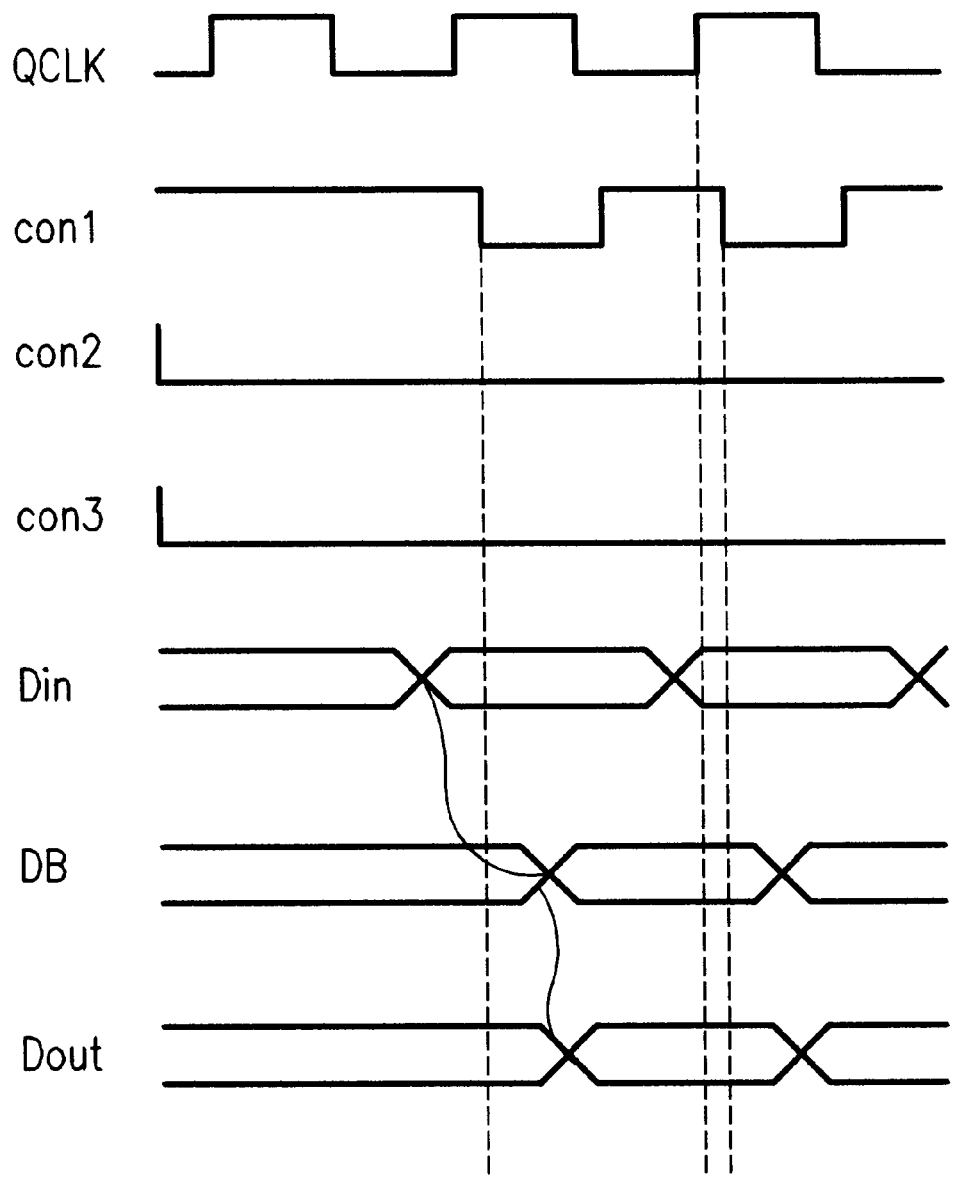
FIG. 6 is a drawing illustrating an operation timing diagram of a related art second CAS latency.
Figure 7:
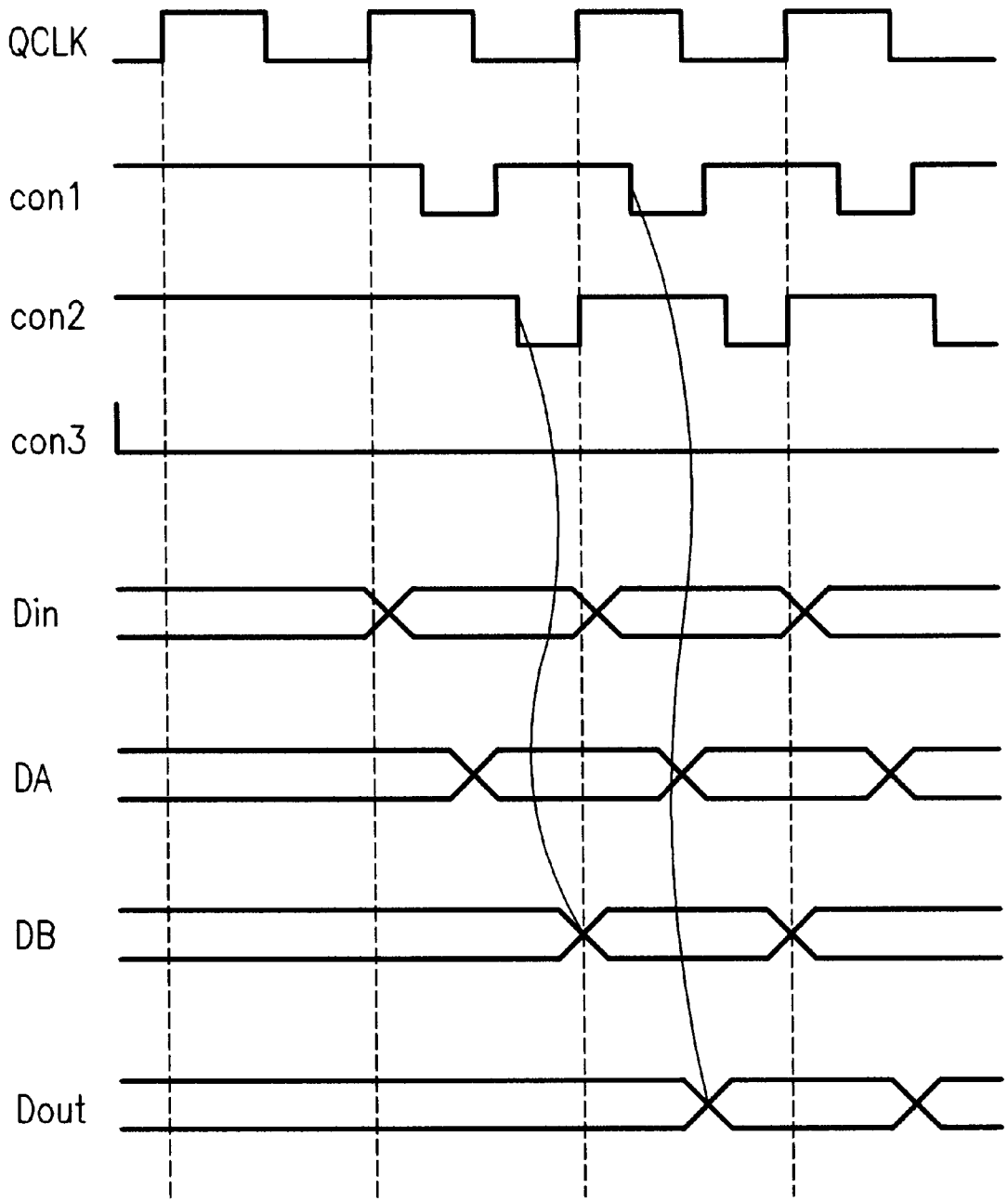
FIG. 7 is a drawing illustrating an operation timing diagram of a related art third CAS latency.
Figure 8:
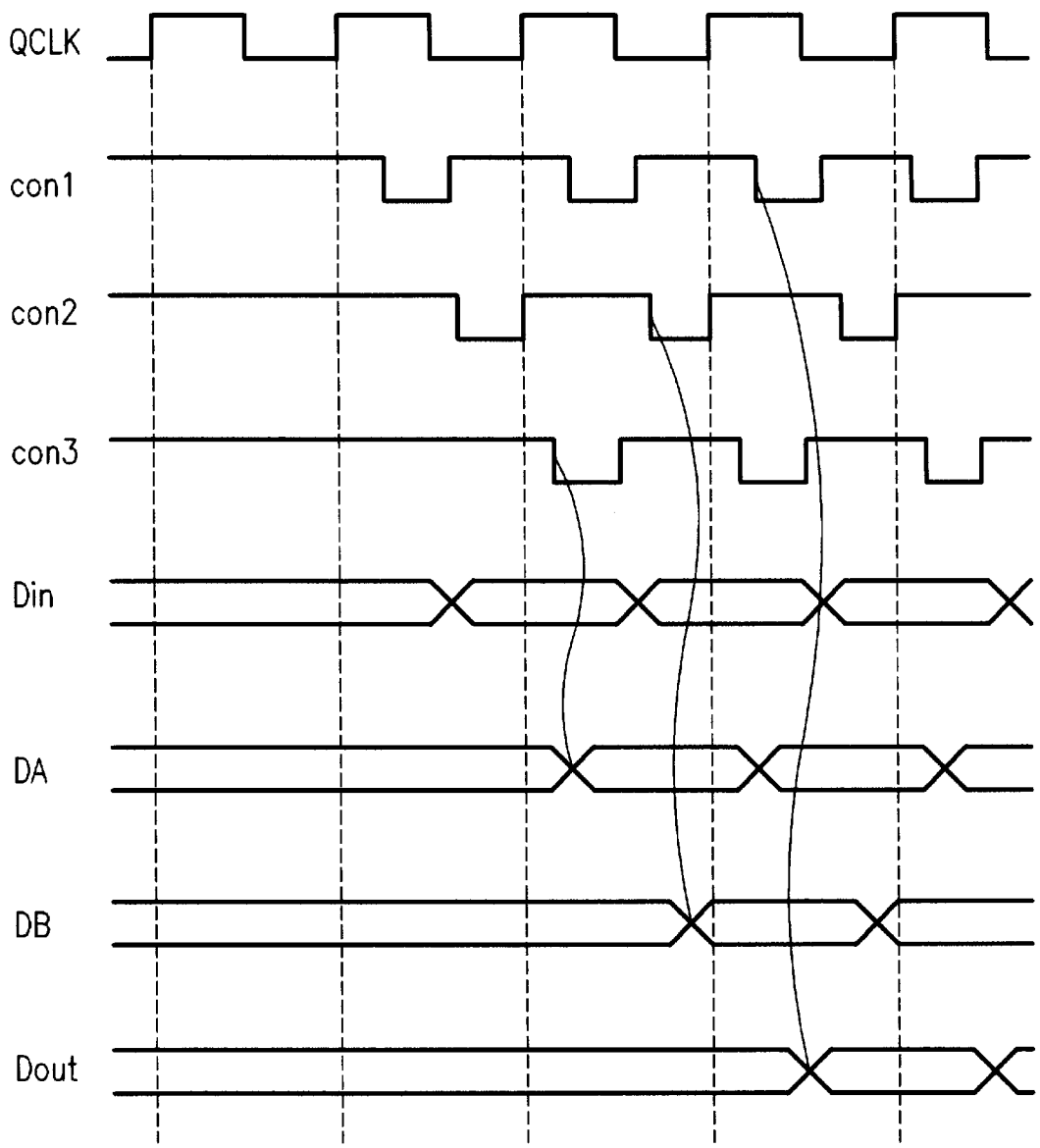
FIG. 8 is a drawing illustrating an operation timing diagram of a related art first CAS latency.
Figure 9:
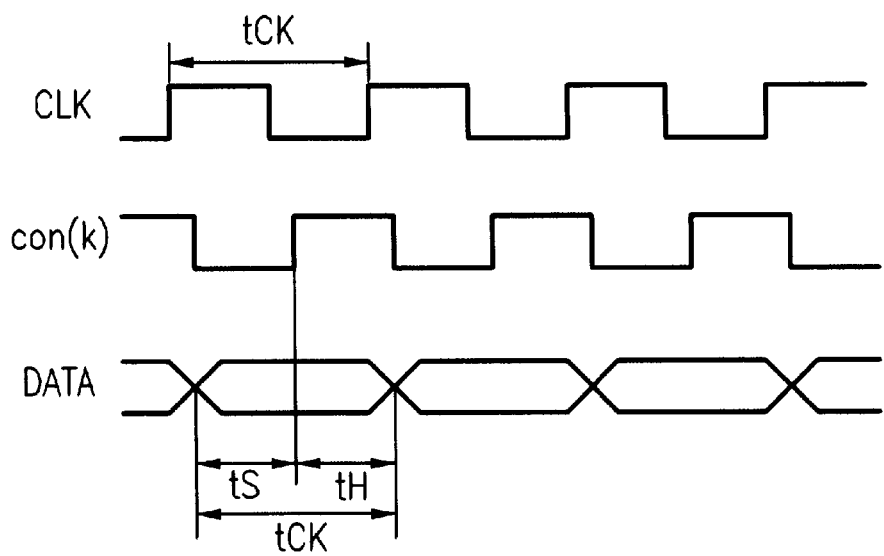
FIG. 9 is a drawing which illustrates a timing diagram for data output with no clock signal QCLK and data skews in the operation of a related art CAS latency.
Figure 10:
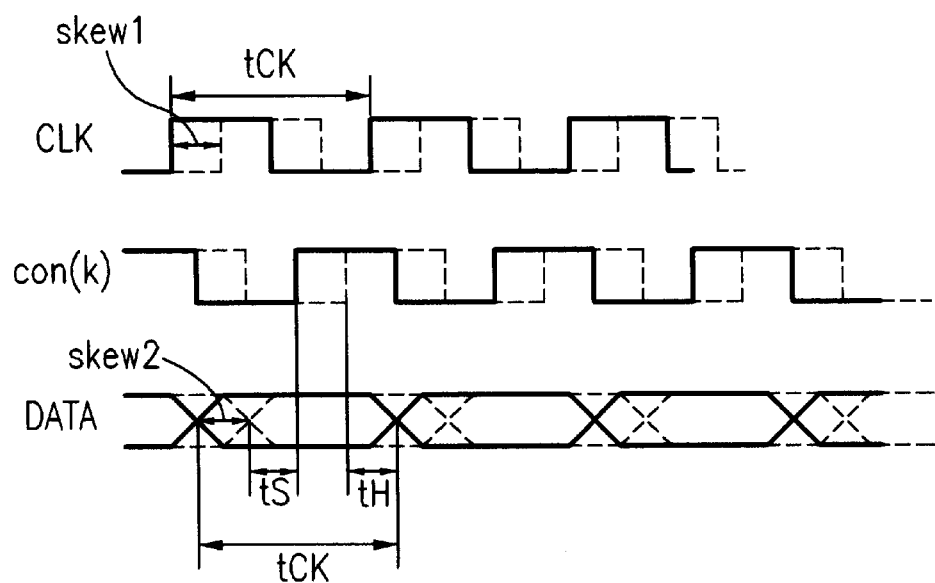
FIG. 10 is a drawing which illustrates a timing diagram for data output having clock signal QCLK and data skews in the operation of a related art CAS latency.
Figure 11:
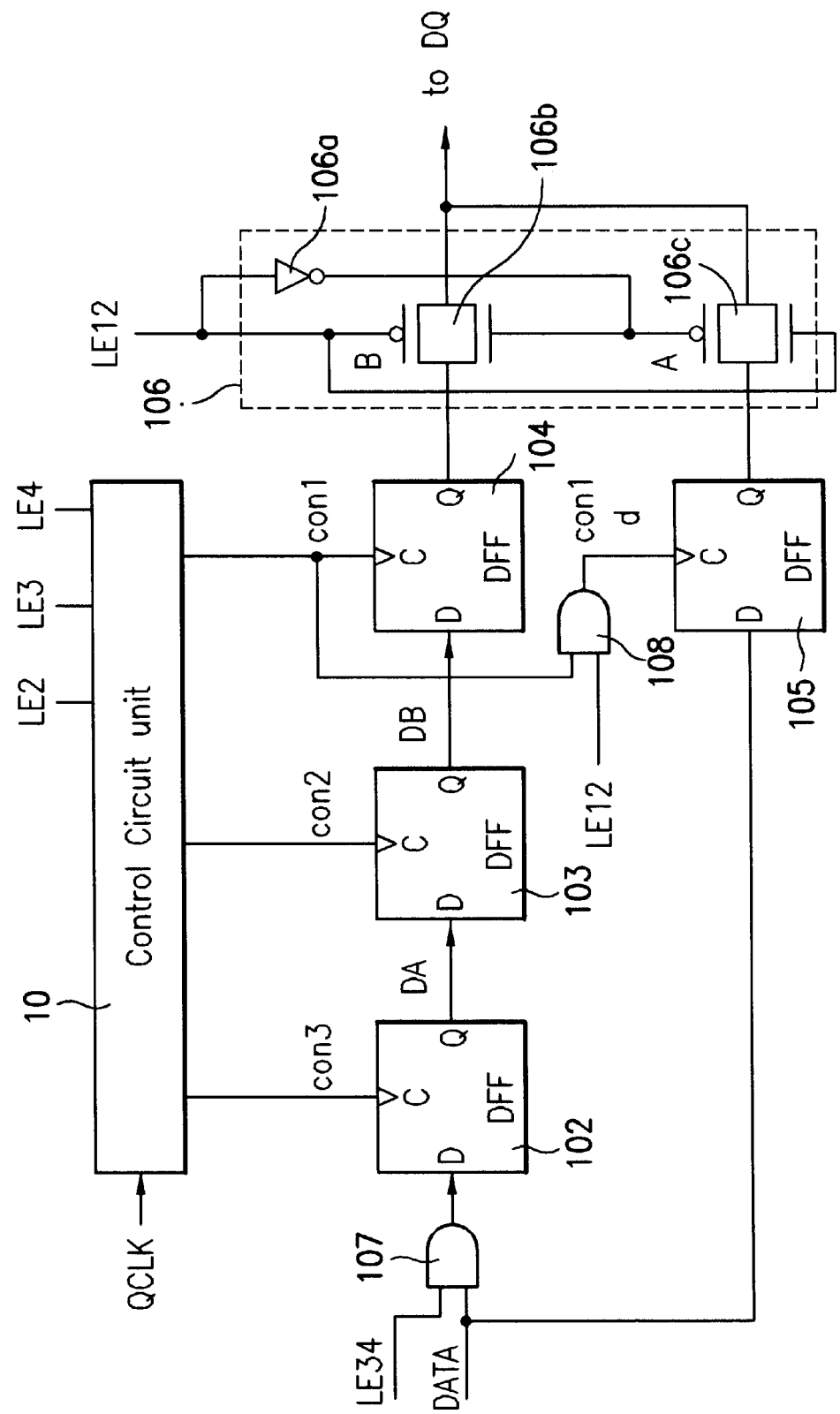
FIG. 11 is a drawing which illustrates a system of a CAS latency control circuit according to a first preferred embodiment.

Referring to FIG. 11, the CAS latency control circuit according to a first preferred embodiment includes a control circuit unit 101 adapted to receive the clock signal QCLK. The control circuit 101 regulates data output by providing control signals con1, con2 and con3 which control latches 102, 103, 104, and 105. The circuit further includes a first AND gate 107 for logically combining a CAS latency control signal LE34 from a mode register of the SDRAM with internal data, and a first latch 102 for forwarding or latching data from the first AND gate 107 depending on the value of the control signal con3 from the control circuit unit 101. Next, there is provided a second latch 103 for forwarding or latching data from the first latch 102 in accordance with the value of the control signal con2, and a third latch 104 for forwarding or latching a data from the second latch 103 in accordance with the value of the control signal con1.

The CAS latency control circuit also includes a second AND gate 108 for logically combining a control signal con1 with a CAS latency control signal LE12 from a mode register of the SDRAM. A fourth latch 105 then forwards or latches internal data in response to a signal from the second AND gate 108, and a data path selecting unit 106 passes data either from the third latch 104 or from the fourth latch 105 to a data output buffer, as determined by the CAS latency control signal LE12 from the mode register of the SDRAM.

The data path selecting unit 106 includes an inverter 106a for inverting a CAS latency control signal LE12 from the mode register of the SDRAM and a first transmission gate 106b for transmitting an output from the third latch 104 to the data output buffer in response to the CAS latency control signal LE12 and a signal from the inverter 106a. The data path selecting unit 106 further includes a second transmission gate 106c for transmitting data from the fourth latch 105 to the data output buffer in response to the CAS latency control signal LE12 and a signal from the inverter 106a.

Figure 12:
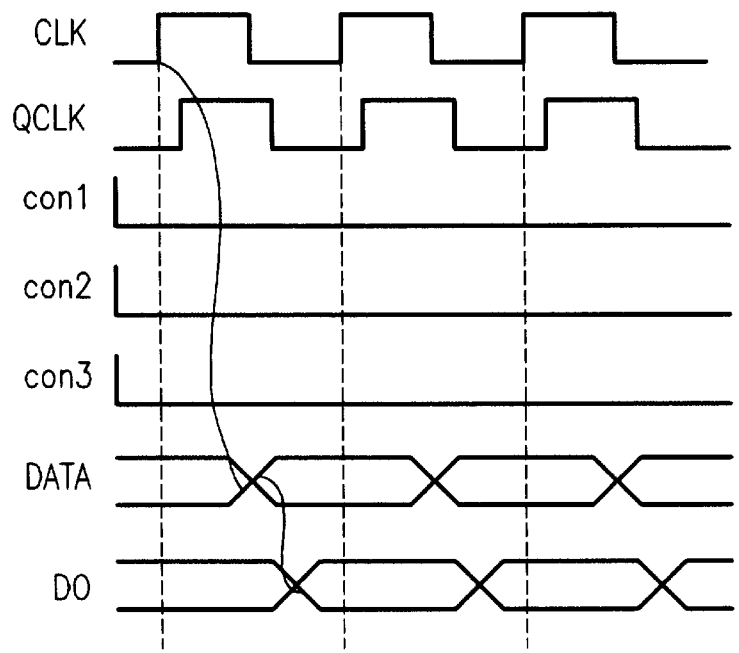
FIG. 12 is a drawing which illustrates a first timing diagram of the CAS latency control circuit operation.
Figure 13:
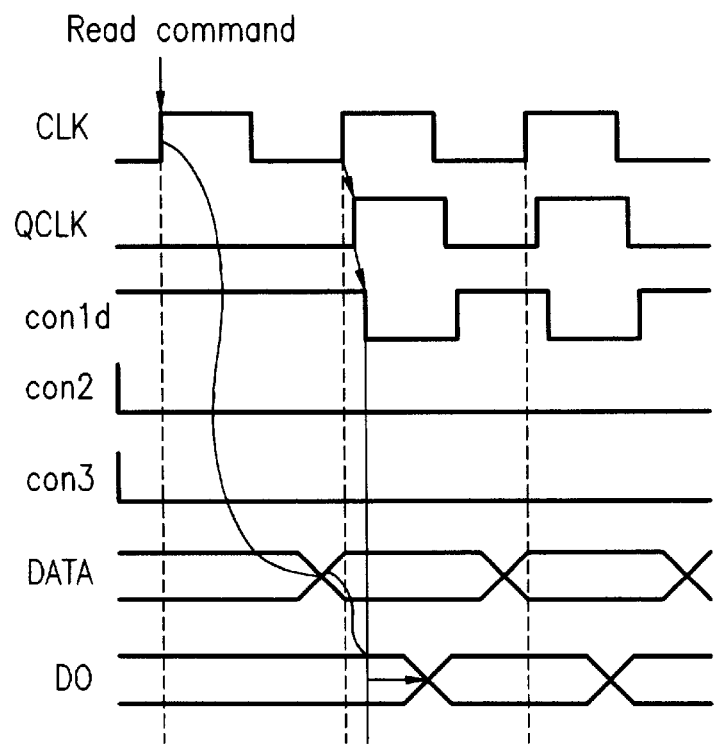
FIG. 13 is a drawing which illustrates a second timing diagram of the CAS latency control circuit operation.
Figure 14:
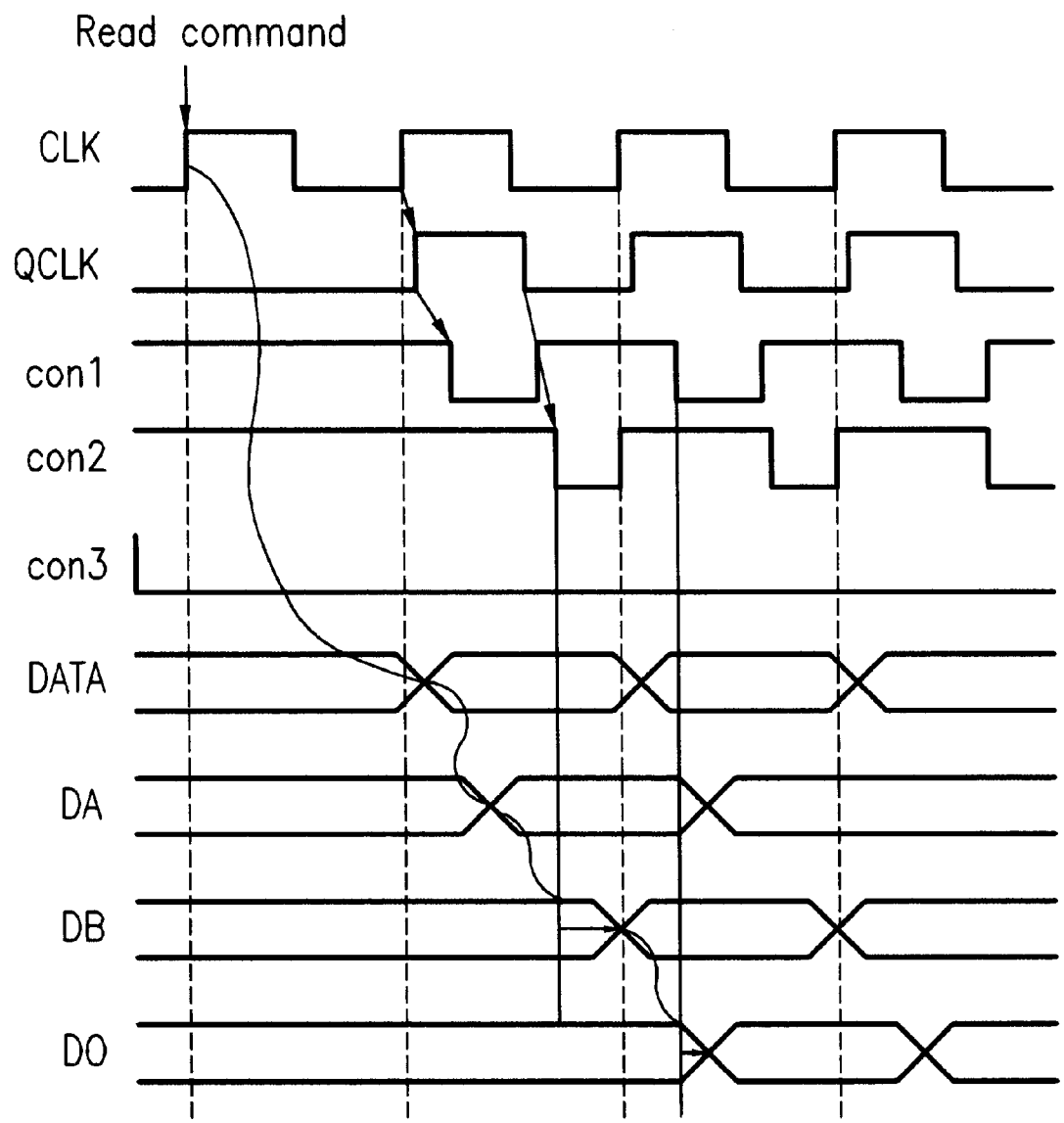
FIG. 14 is a drawing which illustrates a third timing diagram of the CAS latency control circuit operation.

The operation of the CAS latency control circuit according to the first embodiment will now be described. FIG. 11 illustrates a first timing diagram of the CAS latency control circuit operation. FIG. 12 illustrates a second timing diagram of the CAS latency control circuit operation. FIG. 13 illustrates a third timing diagram of the CAS latency control circuit operation. FIG. 14 illustrates a fourth timing diagram of art CAS latency control circuit operation.

Initially, in the read mode of the SDRAM, the main amplification units MA0i-MA0j, MA1i-MA1j, MA2i-MA2j, or MA3i-MA3j in a selected bank amplify data in the bank and provide it to respective data buses DATAi-DATAj. In this instance, the main amplification units MA0i-MA0j, MA1i-MA1j, MA2i-MA2j, or MA3i-MA3j in the unselected banks provide high impedances.

An external clock signal is provided to the QCLK buffer through the clock pads, and the QCLK buffer generates an internal clock signal QCLK. The internal clock signal QCLK and data provided through respective data buses DATAi-DATAj are then forwarded to respective CAS latency control circuits CLCCi-CLCCj. The control circuit unit 1 receives the clock signal QCLK and generates control signals con1, con2, and con3. Additionally, each of the CAS latency control circuits CLCCi-CLCCj receives the signals LE2, LE3, LE4, LE12, and LE34 which are generated by a CAS latency mode setup of the SDRAM and provided from the mode register. During a first and second CAS latency operation, the signal LE12 is set to "high" and the signal LE34 is set to "low." Alternatively, in a third and fourth CAS latency operation, the signal LE12 is set to "low" and the signal LE34 is set to "high." Additionally, during the first CAS latency operation, all the signals LE2, LE3, and LE4 are set to "low." During the second, third, and fourth CAS latency operation, signals LE2, LE3, and LE4 are set to "high" and are held at "low" in other cases.

Referring to FIG. 12, as the signals LE2, LE3, LE4, aced LE34 transition to "low" and the signal LE12 transitions to "high," and the control signals con1, con2, and con3 are all at "low" in response to the LE2, LE3, and LE4, the first, second, and third latches 102, 103, and 104 are bypassed and receive no data. Meanwhile, the fourth latch 105 receives data, but passes the data because the control signal con1 and the signal LE12 are at "low." Further, since the signal LE12 is "low," the data path selecting unit 106 forwards the data from the fourth latch 105 to the data output buffer. Thus, data is forwarded within one cycle from a read command.

Referring to FIG. 13, the signals LE2 and LE12 are set to "high," the signals LE3, LE4, and LE34 are set to "low," a read command is received, and the clock signal QCLK is generated after one cycle. The control circuit unit 101 provides an inverted signal of the clock signal QCLK as a control signal, and the control signals con2 and con3 are held "low" by LE2, LE3, and LE4. Because the signal LE12 is "high," the first latch 105 and the second transmission gate 106c in the data path selecting unit 6 are enabled. During this operation, the fourth latch 105 releases latched data when the control signal con1 is "low," and latches data when the control signal con1 is "high" for one cycle until the control signal con1 subsequently transitions to "low" again. Because the control signal con1 is enabled one cycle after the read command, data is presented from the SDRAM within two cycles.

Referring to FIG. 14, the signals LE34 and LE3 transition to "high" and the signals LE12, LE2, and LE4 transition to "low." Therefore, since the signal LE12 is "low," the fourth latch 105 and the second transmission gate 106c in the data path selecting unit 106 are turned off. Since the signal LE34 is "high," the first, second, and third latches 102, 103, and 104 and the first transmission gate 106b in the data path selecting unit 106 are enabled.

During this operation, the control circuit unit 101 holds control signal con3 "low" and control signals con1 and con2 "high" in response to the signals LE2, LE3, and LE4. Control signal con1 transitions from "high" to "low" after a first rising edge of the clock signal QCLK, and from "low" to "high" again after a first time period. Control signal con2 transitions from "high" to "low" after a first falling edge of the clock signal QCLK, and from "low" to "high" again after a second time period. The control signals con1 and con2 repeat this process continuously with each cycle of the clock signal QCLK.

Since the control signal con3 is held at "low," the first latch 102 passes the data to the second latch 103. When the control signal con2 transitions to "low," the data passes through the second latch 103 to the third latch 104. In this instance, since the control signal con2 transitions to "high" again, the second latch 103 latches the data before passing it to the third latch 104 when the control signal con2 transitions to "low" again. Further, when the control signal con1 transitions to "low" for the second time, the third latch 104 passes the data to the data output buffer. If, however, the control signal con1 transitions to "high" again, the third latch 104 latches data until the next cycle. Thus, data is outputted from the SDRAM within three cycles after the read command.

Figure 15:
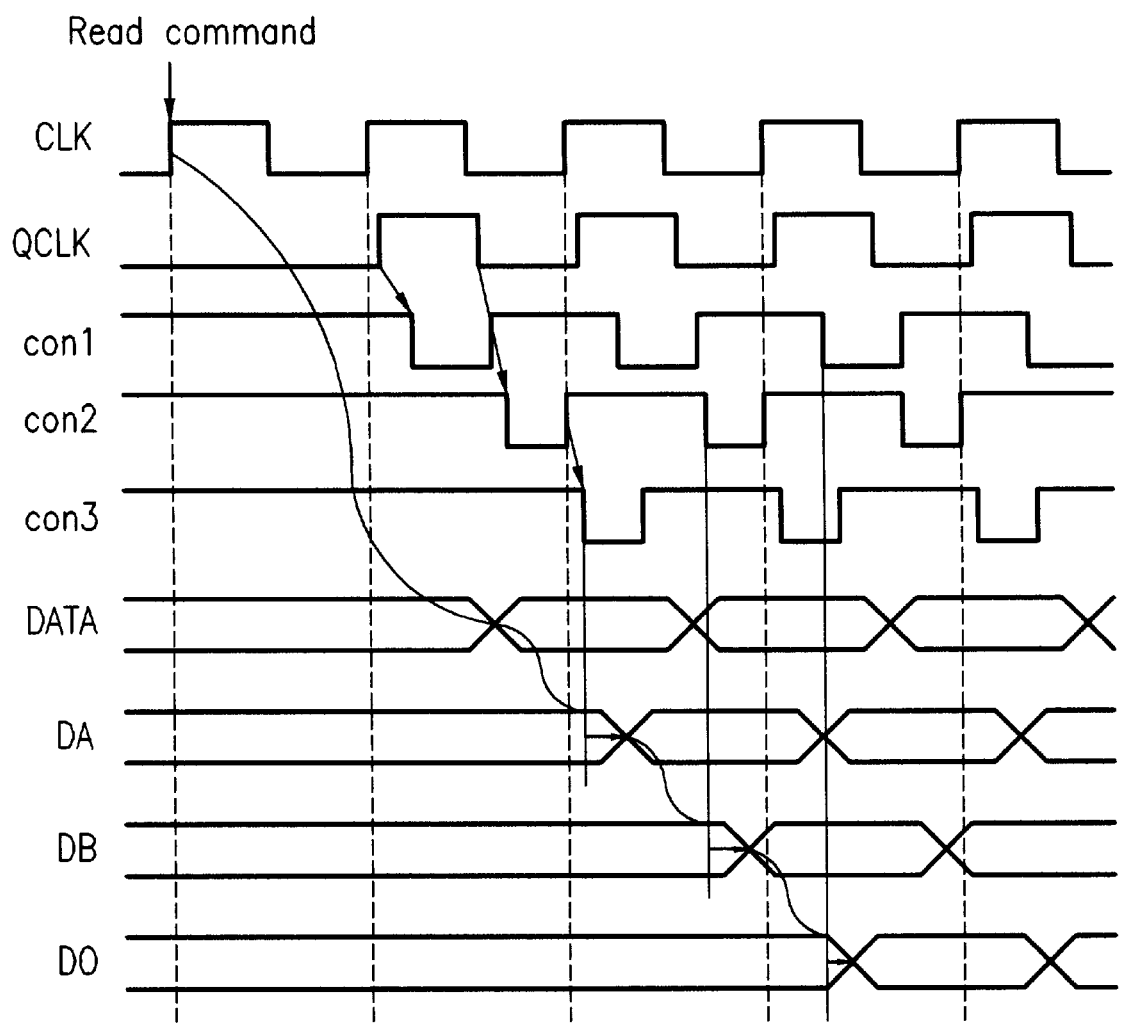
FIG. 15 is a drawing which illustrates a fourth timing diagram of the CAS latency control circuit operation.

As shown in FIG. 15, signals LE34 and LE4 are set to "high" to enable the first, second, and third latches 102, 103, and 104 and the first transmission gate 106b in the data path selecting unit 106. The control circuit unit 101 thus initially provides the control signals con1, con2, and con3 in a "high" state. As respective control signals subsequently transition to "low," the first latch 102 releases latched data to the second latch 103, the second latch 103 releases data to the third latch 104, and the third latch 104 provides the data to the data output buffer. When respective signals transition from "low" to "high," on the other hand, each respective latch latches data. Thus, data can be outputted within four cycles from the read command.

Figure 16:
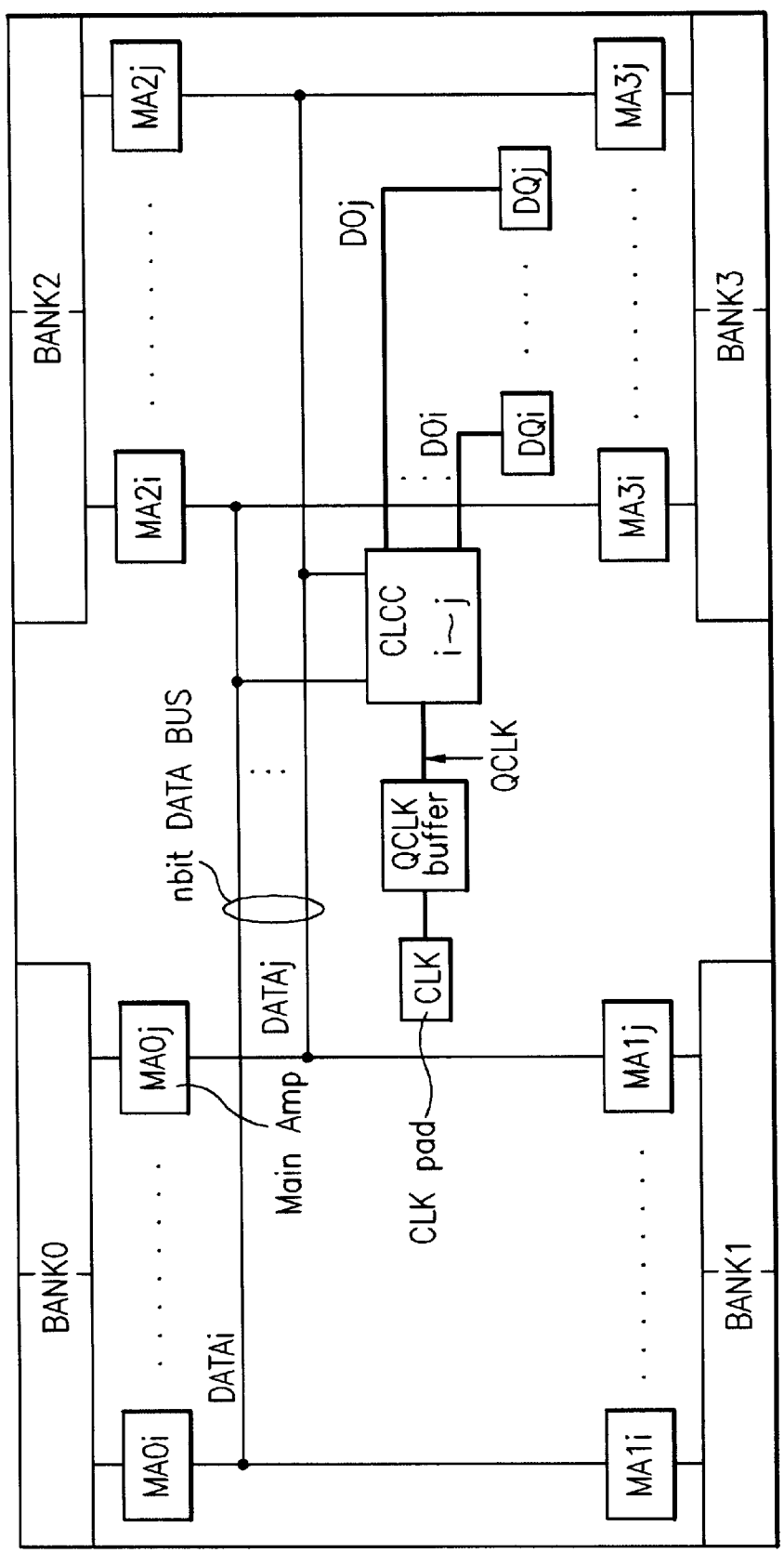
FIG. 16 is a drawing which illustrates a preferred embodiment of CAS latency control circuits on a SDRAM.

Referring to FIG. 16, a SDRAM according to a preferred embodiment of the present invention has four banks BANK0, BANK1, BANK2, and BANK3. Each bank has n main amplification units MA0i-MA0j, MA1i-MA1j, MA2i-MA2j, and MA3i-MA3j, which are secondary amplifier circuits. The circuit further includes n-bit data buses nbit DATA BUS between the first and second banks and the third and fourth banks. The main amplification units MA0i-MA0j, MA1i-MA1j, MA2i-MA2j, and MA3i-MA3j in each bank share respective data buses DATAi-DATAj. Since locations of input/output pins are fixed, n DQ blocks DQi-DQj, each including a data output buffer and an input/output pad, are located at prescribed locations.

CAS latency control circuits CLCCi-CLCCj, one to one matched to the data buses, are arranged such that they are concentrated in a position central to the data buses. That is, the (i)th CAS latency control circuits share an (i)th data bus at a location central between the first and second banks and the third and fourth banks. Further, the CAS latency control circuits CLCCi-CLCCj are arranged such that length of connection lines between outputs from the CAS latency control circuits CLCCi-CLCCj to respective DQ blocks DQi-DQj are different from one another.

A clock signal buffer QCLK buffer applies a clock signal QCLK to the CAS latency control circuits CLCCi-CLCCj, and is positioned adjacent to the clock pad. Connection lines from the clock signal QCLK are connected to respective CAS latency control circuits CLCCi-CLCCj.

Figure 17:
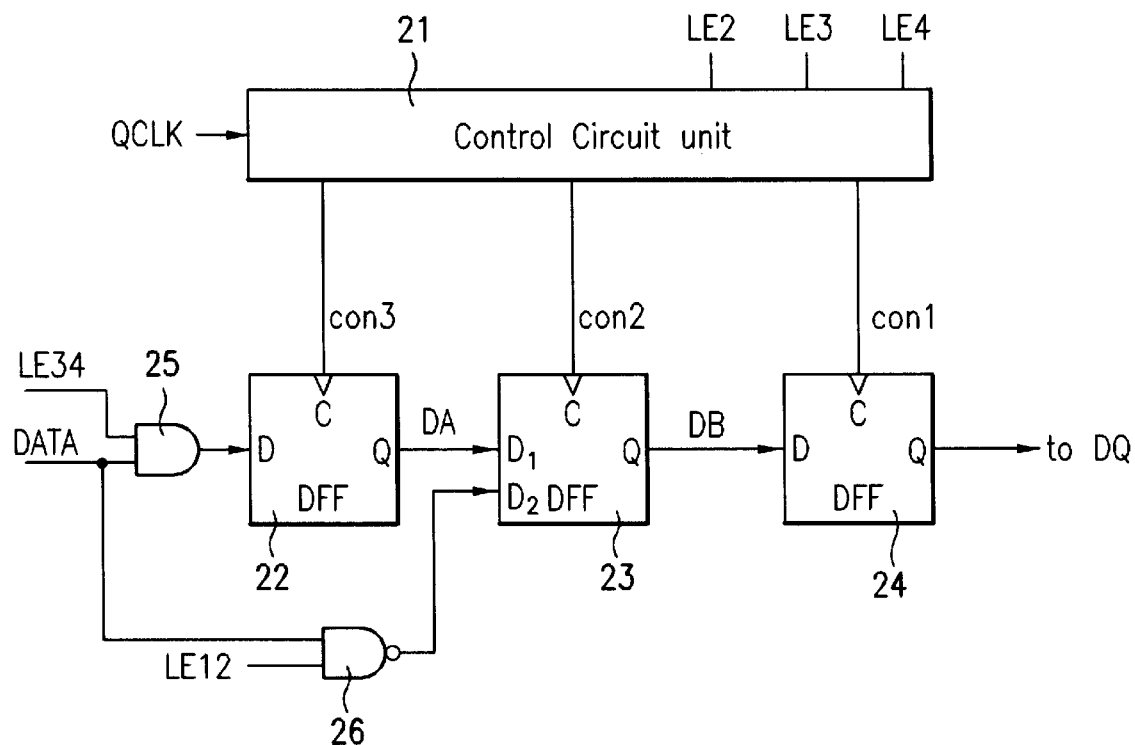
FIG. 17 is a drawing which illustrates a CAS latency control circuit in accordance with a second preferred embodiment of the present invention.

Referring to FIG. 17, a second preferred embodiment includes a control circuit unit 21 for regulating data output. The control circuit is adapted to receive a clock signal QCLK and to receive control signals LE2, LE3, and LE4 provided from a mode register of a SDRAM. The control circuit 21 control signals con1, con2, and con3 control respective latches 24, 23, 22. The circuit further includes an AND gate 25 for logically combining a CAS latency control signal LE34 provided from the mode register of the SDRAM with data from the SDRAM. Also, the circuit includes a first latch 22, which passes or latches data from the AND gate 25 in response to the control signal con3 from the control circuit unit 21, and a NAND gate 26, which logically combines a CAS latency control signal LE12 provided from the mode register of the SDRAM with data from the SDRAM.

Next, the circuit includes a multiplexing latch 23 for passing or latching a data from the first latch 22 or passing or latching data from the NAND gate 26, in response to the control signal con2 from the control circuit unit 21. A second latch 24 passes data from the multiplexing latch 23 to a data output buffer, or latches the data in response to the control signal con1 from the control circuit unit 21.

Figure 18:
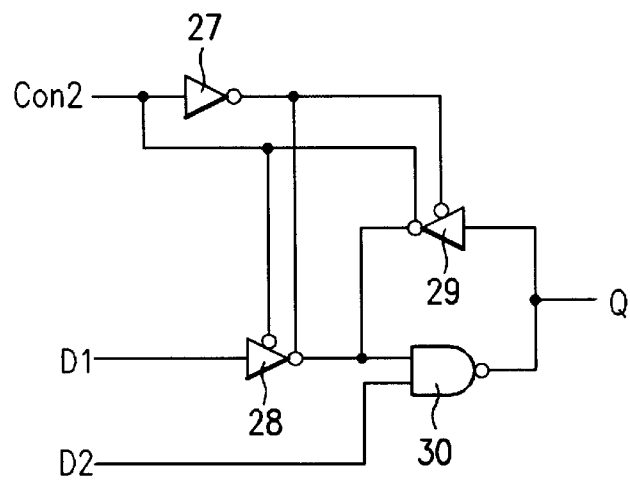
FIG. 18 is a drawing which illustrates a latch in accordance with a preferred embodiment of the present invention.

FIG. 18 shows details of one embodiment of the multiplexing latch 23. According to this embodiment, the multiplexing latch 23 includes an inverter 27 for inverting the control signal con2 from the control circuit unit 21 and a first clocked inverter 28 for inverting, and either passing or blocking data D1 from the first latch 22 in response to each of a signal from the inverter 27 and the control signal con2. The multiplexing latch 23 also includes a NAND gate 30 for logically combining data from the first clocked inverter 28 with data D2 from the NAND gate 26. The output of the NAND gate 30 is provided to the data output buffer. A second clocked inverter 29 inverts and latches data from the NAND gate 30 in response to the signal from the inverter 27 and the control signal con2.

The operation of the invention according to this embodiment of the CAS latency control circuit will now be described. The control signals con1, con2, and con3 from the control circuit unit 21 and the control signals LE2, LE3, LE4, LE12, and LE34 from the mode register of the SDRAM are the same as those of the related art, except that the data is provided to an input terminal D2 on the multiplexing latch 23 through the NAND gate 26 in first and second CAS latency operations, and the path is disabled in the third and fourth CAS latency operations.

During the first CAS latency operation, the signals LE2, LE3, LE4, and LE34 transition to "low," and the signal LE12 transitions to "high." The control circuit unit 21 provides all the control signals con1, con2, and con3 at "low" in response to the signals LE2, LE3, and LE4, and the AND gate 25 provides a "low" signal regardless of the value of data. Accordingly, data in the SDRAM is inverted by the NAND gate 26, and provided to the data output buffer through the multiplexing latch 23 and the second latch 24.

During the second CAS latency operation, the control signals LE2 and LE12 are set to "high" and the control signals LE3, LE4, and LE34 are set to "low." The clock signal QCLK is generated one clock cycle after reception of a read command. The control circuit unit 21 provides an inverted clock signal QCLK as the control signal con1, and holds the control signals con3 and con2 "low." Since the control signal LE34 is "low" and the control signal LE12 is "high," data in the SDRAM is forwarded through the multiplexing latch 23 and the second latch 24. The second latch 24 releases latched data when the control signal con1 is "low" and latches data for one cycle starting when the control signal con1 is "high" until the control signal con1 transitions to "low." Since the control signal con1 is enabled one cycle after the read command, the data is outputted from the SDRAM within two cycles.

During the third CAS latency operation, the control signals LE34 and LE3 transition to "high" and the control signals LE12, LE2, and LE4 transition to "low." Therefore, since signal LE12 is "low," the NAND gate 26 is turned off. Also, since the signal LE34 is "high," the first and second latch 22 and 24 and the D1 terminal on the multiplexing latch 23 are enabled. The control circuit unit 21 holds the control signal con3 "low" and the control signals con1 and con2 "high" in response to the control signals LE2, LE3, and LE4. Thus, the control signal con1 transitions from "high" to "low" after a first rising edge of the clock signal QCLK and from "low" to "high" again after a time period. Further, the control signal con2 transitions from "high" to "low" at a first falling edge of the clock signal QCLK and from "low" to "high" again after a time period. The control signals con1 and con2 repeat the foregoing process continuously with each cycle of clock signal QCLK. Accordingly, since the control signal con3 is held at "low," the data is provided to the D1 terminal on the multiplexing latch 23 through the first latch 22, and when the control signal con2 transitions to "low," the data is provided to the second latch 24 through the multiplexing latch 23. Since the control signal con2 transitions to "high" again, the multiplexing latch 23 latches the data, and subsequently passes it to the second latch 24 when the control signal con2 again transitions to "low." If the control signal con1 transitions to "low" for the second time, the second latch 24 provides the data to the data output buffer, and when the control signal con1 transitions to "high" again, keeps the data latched thereto until the next cycle when the control signal again transitions to "low."

In the fourth CAS latency operation, as in the third CAS latency operation, the signals LE34 and LE4 are set to "high," thus enabling the first and second latches 22 and 24 and the D1 terminal on the multiplexing latch 23. The control circuit unit 21 provides control signals con1, con2, and con3. Therefore, when a pertinent control signal transitions to "low," the first latch 22 provides latched data to the D1 terminal on the multiplexing latch 23. The multiplexing latch 23 in turn provides data to the second latch 24, and the second latch 24 provides data to the data output buffer, and latches the data if a pertinent control signal transitions from "low" to "high."

The embodiments of the CAS latency control circuit of the present invention have at least the following advantages. The parallel data pass depending on CAS latencies can prevent passing through unnecessary latches thus reducing data delay. That is, in the first and second latency operations in the related art, the serial pass of data through the unnecessary first and second latching means caused the data delay. The prevention of data delay allows a faster SDRAM.

Additionally, the CAS latency control circuit of the present invention have at least the following advantages. The concentrated location of the CAS latency control circuits central to a chip facilitates elimination of clock signal QCLK skews between the CAS latency control circuits, and reduces data skews between banks. The reduction of the clock and data skews improves the operation of SDRAMs at high frequencies.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A latency control circuit comprising:
    a control circuit adapted to receive a clock signal to regulate data output and a plurality of input signals to provide first, second and third control signals;
    a first logic gate to logically combine a CAS latency control signal with data;
    a first latch to pass or latch data from said first logic gate in response to the third control signal from said control circuit unit;

a second logic gate to logically combine a second logic gate control signal with data;

a second latch to pass or latch data from said first latch or to pass or latch a data from said second logic gate in response to the second control signal from the control circuit unit; and a third latch to pass data from said second latch to a data output buffer or latch the data in response to the first control signal from said control circuit unit.

2. The circuit of claim 1, wherein said second latch comprises:

an inverter to invert one of the plurality of control signals from the control circuit unit;

a first clocked inverter to invert, and either pass or block a first data from the first latch in response to a signal from the inverter and the second control signal;

a third logic gate for logically processing data from the first clocked inverter with a second data from said second logic gate and outputting a result to the data output buffer; and a second clocked inverter to invert and latch data from said third logic gate in response to the signal from the inverter and the second control signal.

3. A latency control circuit, comprising:

a first data latch responsive to a first control signal;

a controller, wherein said controller receives a clock signal and generates the first control signal, said first data latch being coupled to receive first and second input signals and output a first output signal, wherein the first output signal is one of (1) the first input signal forwarded without latching through said first data latch, (2) the first input signal latched and subsequently forwarded through said first data latch, (3) the second input signal forwarded without latching through said first data latch, and (4) the second input signal latched and subsequently forwarded through said first data latch, in response to the first control signal.

4. The circuit of claim 3, wherein said first data latch further comprises:

a first inverter;

first and second clocked inverters; and a first logic gate, wherein an input terminal of the first inverter is coupled to a control terminal of the first clocked inverter and an output terminal of the second clocked inverter, an output terminal of the first inverter is coupled to an output terminal of the first clocked inverter and a control terminal of the second clocked inverter, a first input terminal of said first logic gate is coupled to the output terminal of the first clocked inverter and the output terminal of the second clocked inverter, an output terminal of said first logic gate is coupled to an input terminal of the second clocked inverter, and the input terminal of said first inverter is coupled to receive the first control signal, an input terminal of said first clocked inverter is coupled to receive the first input signal, and a second input terminal of said first logic gate is coupled to receive the second input signal.

5. The circuit of claim 4, wherein said first clocked inverter either passes or blocks the first input signal in response to an output of the first inverter and the first control signal, said first logic gate logically combines data outputted from said second clocked inverter with the second input signal to generate the first output signal, and said second clocked inverter inverts and latches an output of said first logic gate in response to the output from said first inverter and the first control signal.

6. The circuit of claim 3, further comprising:

a second data latch responsive to a second control signal, wherein said controller generates the second control signal, said second latch receives an input signal and generates a second output signal, the second output signal being one of (1) the input signal forwarded without latching through said second data latch, and (2) the input signal latched and subsequently forwarded through said second data latch, in response to the second control signal.

7. The circuit of claim 6, wherein said second output signal is provided to said first data latch as the first input signal.

8. The circuit of claim 7, further comprising:

a first logic gate which logically combines a data signal with a first latency control signal to generate the second input signal to said first data latch.

9. The circuit of claim 8, further comprising:

a second logic gate which logically combines the data signal with a second latency control signal to generate the input signal to said second data latch.

10. The circuit of claim 9, wherein said first logic gate is a NAND gate and said second logic gate is an AND gate.

11. The circuit of claim 6, further comprising:

a third data latch responsive to a third control signal, wherein said controller generates the third control signal, said third data latch receives the output of the first data latch as an input signal, and generates a third output signal, the third output signal being one of (1) the input signal forwarded without latching through said third data latch, and (2) the input signal latched and subsequently forwarded through said third data latch, in response to the third control signal.

12. The circuit of claim 11, wherein said controller further receives a plurality of latency control signals, the plurality of latency control signals being used to generate the first, second, and third control signals.

13. The memory device of claim 4, wherein an (i)th CAS latency control circuit is positioned central to an (i) data bus such that the (i)th CAS latency control circuit is distanced the same from an (i)th main amplification unit in each bank.

14. The circuit of claim 3, wherein the latency control circuit is a Column Address Strobe (CAS) latency control circuit.

15. The circuit of claim 3, wherein the first data latch comprises:

a second data latch, coupled to receive the first input signal, and output one of the first input signal forwarded without latching through the second data latch and the first input signal latched and subsequently forwarded through the second data latch;

a third data latch coupled to receive the second input signal, and output one of the second input signal forwarded without latching through the third data latch and the second input signal latched and subsequently forwarded through the third data latch;

a selection circuit responsive to a first latency control signal to select one of the output of the second data latch and third data latch as the first output signal.

16. The circuit of claim 15, further comprising a first logic gate, which logically combines the first control signal with a second latency control signal, wherein the second data latch is responsive to the first control signal, and the third data latch is responsive to an output of the first logic gate.

17. The circuit of claim 15, wherein the selection circuit comprises, an inverter, which inverts the first latency control signal, a first transmission gate, which transmits an output of the second data latch to a data output buffer in response to the first latency control signal and an output of the inverter, and a second transmission gate which transmits an output of the third latch to the data output buffer in response to the first latency control signal and a signal from the inverter.

18. The circuit of claim 17, wherein the first latency control signal is a Column Address Strobe (CAS) latency control signal.

19. The circuit of claim 15, further comprising a fourth data latch, responsive to a second control signal, and a fifth data latch, responsive to a third control signal, wherein the fourth data latch provides the first input signal, and wherein the fifth data latch provides an input to the fourth data latch.

20. The circuit of claim 6, further comprising:

a plurality of memory banks, each bank having a plurality of main amplifiers, each main amplifier amplifying output signals from said memory bank;

a plurality of data buses arranged between the plurality of banks, each shared by respective main amplification units; and a clock buffer to apply a clock signal to the latency control circuit, wherein the latency control circuit comprises a plurality of identical latency control sub-circuits concentrated in an area central to the data buses and one to one matched to the data buses to receive signals from the plurality of data buses, and wherein each of the plurality of latency control sub-circuits is coupled to a respective DQ circuit, which receives the outputs of corresponding CAS latency control circuits and provide an output signal, and wherein the distance of each of said plurality of DQ circuits to the latency control circuits is different.

* * * * *